US007785419B2

(12) United States Patent
Tateishi et al.

(10) Patent No.: US 7,785,419 B2
(45) Date of Patent: Aug. 31, 2010

(54) EPITAXIAL APPARATUS

(75) Inventors: Shizuka Tateishi, Tokyo (JP); Yusuke Kurozumi, Tokyo (JP); Yasuhiro Rikihisa, Tokyo (JP)

(73) Assignee: Sumco Corporation, Tokyo (JP)

( * ) Notice: Subject to any disclaimer, the term of this patent is extended or adjusted under 35 U.S.C. 154(b) by 607 days.

(21) Appl. No.: 11/644,931

(22) Filed: Dec. 21, 2006

(65) Prior Publication Data

US 2007/0144437 A1    Jun. 28, 2007

(30) Foreign Application Priority Data

Dec. 27, 2005    (JP)    ............... 2005-375008

(51) Int. Cl.
   *C23C 16/00* (2006.01)
(52) U.S. Cl. .................. 118/725; 118/50; 118/50.1; 118/715; 118/716; 118/722; 118/724
(58) Field of Classification Search ................. 118/724, 118/725, 728, 729, 730; 156/345.51, 345.52, 156/345.53
See application file for complete search history.

(56) References Cited

U.S. PATENT DOCUMENTS

| 5,085,887 | A  | * | 2/1992 | Adams et al. | ............... | 427/585 |
| 6,245,149 | B1 | * | 6/2001 | de Lomenie et al. | ........ | 118/719 |
| 6,455,814 | B1 | * | 9/2002 | Samoilov et al. | ............ | 219/390 |
| 2002/0185062 | A1 | * | 12/2002 | Halpin | ....................... | 118/50.1 |

FOREIGN PATENT DOCUMENTS

| EP | 1235257 | 8/2002 |
| JP | 2001-126995 | 5/2001 |

OTHER PUBLICATIONS

Handbook of Chemistry and Physics. 89th Edition. Copyright 2008-2009 (p. 12-200) Data based on Powell, R. L., and Childs, G. E., in American Institute of Physics Handbook, 3rd Edition, Gray, D. E., Ed., McGraw-Hill, New York, 1972. and Ho, C. Y., et al., J. Phys. Chem. Ref. Data, 7, 959, 1978.*

* cited by examiner

*Primary Examiner*—Parviz Hassanzadeh
*Assistant Examiner*—Tiffany Nuckols
(74) *Attorney, Agent, or Firm*—Kolisch Hartwell, PC (57) ABSTRACT

An epitaxial apparatus, including a supporting member to support a substrate; an external wall provided to surround the supporting member from the sides; an inner lid member provided in a removable manner on the external wall and covering at least a part of a gap between the supporting member and the external wall; an upper lid member that covers the substrate in a region surrounded by the external wall; a holding member that is held by the external wall, holds the upper lid member so that the upper lid member is sandwiched between the holding member and the external wall, and has a cooling unit to cool down a portion that holds the upper lid member; a heating unit; and a covering member provided so as to cover the surface of at least one of the upper lid member and the holding member.

6 Claims, 6 Drawing Sheets

EPITAXIAL APPARATUS

BACKGROUND OF THE INVENTION

1. Field of the Invention

The present invention relates to a sheet form epitaxial apparatus for forming an epitaxial layer on a surface of a substrate by supplying gas thereon.

This application claims priority from Japanese Patent Application No. 2005-375008, filed on Dec. 27, 2005, the content of which is incorporated herein by reference.

2. Background Art

There have been disclosed epitaxial apparatuses which form a silicon single crystal film (hereinafter referred to as "epitaxial film") on a substrate by spraying gas on the substrate while heating by a heating device such as a heater (see, for example, Patent Document 1). In accordance with the aforementioned Patent Document 1, in order to spray the gas efficiently on the substrate supported by a susceptor (or a supporting member), the epitaxial apparatus includes an external wall surrounding the susceptor so as to prevent leakage of the gas sideways/laterally, an upper dome (or an upper lid member) mounted on the external wall on the surface side of the substrate so as to prevent leakage of the gas upward, and a susceptor ring (or an inner lid member) provided between the external wall and the susceptor so as to prevent leakage of the gas downward.

The upper dome is held between a clamp ring (or a holding member) and the external wall through an O ring or the like, and is held in a tight contact condition with both of the clamp ring and the external wall. The susceptor ring is provided in a removable manner on the external wall, for example, and is held in tight contact with the external wall when it is attached thereto. Moreover, in order to prevent the O ring from being distorted by the heat upon being heated, a circulation passage which enables a refrigerant such as water or the like to flow is formed inside the clamp ring; thereby cooling the portion held by the clamp ring and the external wall. Further, reaction products resulting from the generated gas upon being heated adhere to the upper dome and cause contamination of the upper dome. Therefore, the upper dome is formed so as to be cleaned by a chemical such as HCl gas or the like.

However, when the temperature of the clamp ring drops as it is cooled down, heat from other members which are in tight contact with the clamp ring moves to the clamp ring having a lower temperature; thereby generating a heat flow. Due to this heat flow, the heat from the upper dome tends to escape easily through the clamp ring to the open air, so that the temperature of the upper dome drops. As a result, the cleaning efficiency of the HCl gas deteriorates and the reaction products resulting from the generated gas upon being heated tend to remain on the upper dome.

Furthermore, being affected by the heat flow, heat from the susceptor ring moves from the external wall to the clamp ring, so that the heat tends to escape easily from the clamp ring into the open air. Thus, the temperature of the susceptor ring also drops. Once the temperature of the susceptor ring drops, the temperature of peripheral portion of the susceptor which is in close proximity to the susceptor ring drops. Consequently, temperature distribution appears in the substrate supported by the susceptor, and the difference in thermal stress causes slippage in the substrate.

In view of the above circumstances, the object of the present invention is to provide an epitaxial apparatus which can reduce an amount of residual products in the upper lid member, and can prevent slippage which occurs on the substrate, by suppressing the heat flow and the temperature drop in the upper lid member and in the inner lid member when heat is applied.

(Patent Document 1) Japanese Unexamined Patent Application, First Publication No. 2001-126995

SUMMARY OF THE INVENTION

In order to achieve the aforementioned object, the present invention provides the following epitaxial apparatus. The epitaxial apparatus of the present invention is an epitaxial apparatus for forming an epitaxial layer on a surface of a substrate by supplying gas thereon, and the apparatus includes: a supporting member to support a substrate from the rear surface side thereof; an external wall that is provided to surround said supporting member from the sides and that has a gas supply port for supplying gas on the front surface side of the substrate supported by said supporting member; an inner lid member provided in a removable manner on said external wall and covering at least a part of a gap between said supporting member and said external wall; an upper lid member that covers the front surface side of said substrate in a region surrounded by said external wall; a holding member that is held by said external wall, holds said upper lid member so that said upper lid member is sandwiched between said holding member and said external wall, and has a cooling unit inside to cool down a portion that holds said upper lid member; a heating unit to heat a region surrounded by said external wall, said supporting member, said inner lid member, and said upper lid member held by said external wall and said holding member; and a covering member provided so as to cover the surface of at least one of said upper lid member and said holding member.

In accordance with the epitaxial apparatus of the present invention, since the covering member is provided so as to cover the surface of at least one of the upper lid member and the holding member, heat loss from the portion covered by the covering member can be suppressed. Accordingly, the quantity of heat moved from the heated substrate, the inner lid member and the upper lid member to the cooled holding member due to thermal radiation or the like can be reduced, and such a heat flow can be suppressed. Therefore, unnecessary temperature drop of the upper lid member, the resultant temperature drop of the inner lid member due to a decrease in quantity of heat caused by the heat movement from the inner lid member to the upper lid member, and temperature drop of peripheral portions of the substrate caused by the temperature drop of the inner lid member can be suppressed. Thus, the amount of residual products on the upper lid member can be reduced, and slippage caused in the substrate due to the difference in thermal stresses can be suppressed. Moreover, since the covering member only covers the surface, the covering member itself will not be cooled directly by the cooling unit, so that the temperature of the covering member will not drop.

When the upper lid member is to be covered, it is preferable to reduce a region held by the holding member, for example, and to provide the covering member in the resultant free space.

Furthermore, a portion covered (or thermally insulated by being covered) by the covering member may be any portion among the upper lid member and the holding member as long as the portion can prevent the temperature drop of the upper lid member, the inner lid member, the substrate or the like by insulating the heat movement due to thermal radiation or the like from such as the heated substrate or the upper lid member to at least the cooled holding member. Specific shapes and other configurations can be modified in accordance with mounting convenience or the like, and are not to be considered as limiting.

In the epitaxial apparatus of the present invention, the covering member may be provided on the upper lid member in a removable manner.

In the case in which the covering member is attachable to and removable from the upper lid member, by designing the covering member in accordance with the shape of the portion being covered, for example, the heat escape can be suppressed only by attaching the covering member to the conventional upper lid member as it is without re-designing the upper lid member; thereby saving labor and costs for re-designing the upper lid member. Consequently, immediate effects such as the prevention of waste product adhesion, slippage and the like can be obtained even in the conventional apparatuses.

The covering member may be provided on the holding member in a removable manner.

In the case in which the covering member is attachable to and detachable from the holding member, by designing the covering member in accordance with the shape of the portion being covered, for example, heat escape can be suppressed only by attaching the covering member to the conventional holding member as it is without re-designing the holding member; thereby saving labor and costs for re-designing the holding member. In particular, since the cooling unit is provided in the holding member, it is necessary to take a disposition of the cooling device into account upon re-designing the holding member, so that the fact that labor and costs for re-designing the holding member can be saved is significant.

A gap may be provided between the covering member and the upper lid member or the holding member which is covered by the covering member.

This gap can prevent the covering member from being damaged by thermal expansion. Moreover, the heat can be trapped in the gap between the covering member and the portion being covered (such as the upper lid member). Furthermore, an air layer in the gap can be used as a heat insulator so that the quantity of heat escaping from the covering member to the holding member can be reduced. Consequently, the temperature rise of the holding member, and the temperature drop of the upper lid member caused by the temperature drop of the covering member can be suppressed. Accordingly, an amount of residual product on the upper lid member can be further reduced, and slippage caused by the temperature drop of peripheral portions of the substrate can be further suppressed.

Thermal conductivity of the covering member may be set in a range of 1 to 20 W/mK.

By setting the thermal conductivity in this range, residual products being adhered and remaining on the upper lid member can be further reduced and slippage caused by the temperature drop of peripheral portions of the substrate can be further suppressed.

The covering member may include stainless steel.

Since stainless steel has lower thermal conductivity than those of other materials such as steel and aluminum, by manufacturing the covering member by using stainless steel, the heat in the covered portion can be prevented from escaping into the open air through the covering member.

In accordance with the epitaxial apparatus of the present invention as described above, the temperature drop of the upper lid member and that of the inner lid member when heat is applied are suppressed by suppressing the heat flow; thereby enabling the reduction of residual product being adhered to the upper lid member, and to prevent slippage occurring in the substrate.

BRIEF DESCRIPTION OF THE DRAWINGS

FIGS. 5 (a) and 5 (b) are views showing the state of the upper dome after heat is applied.

PREFERRED EMBODIMENTS

The first embodiment of the present invention will be described below with reference to the accompanying drawings.

Figure 1:
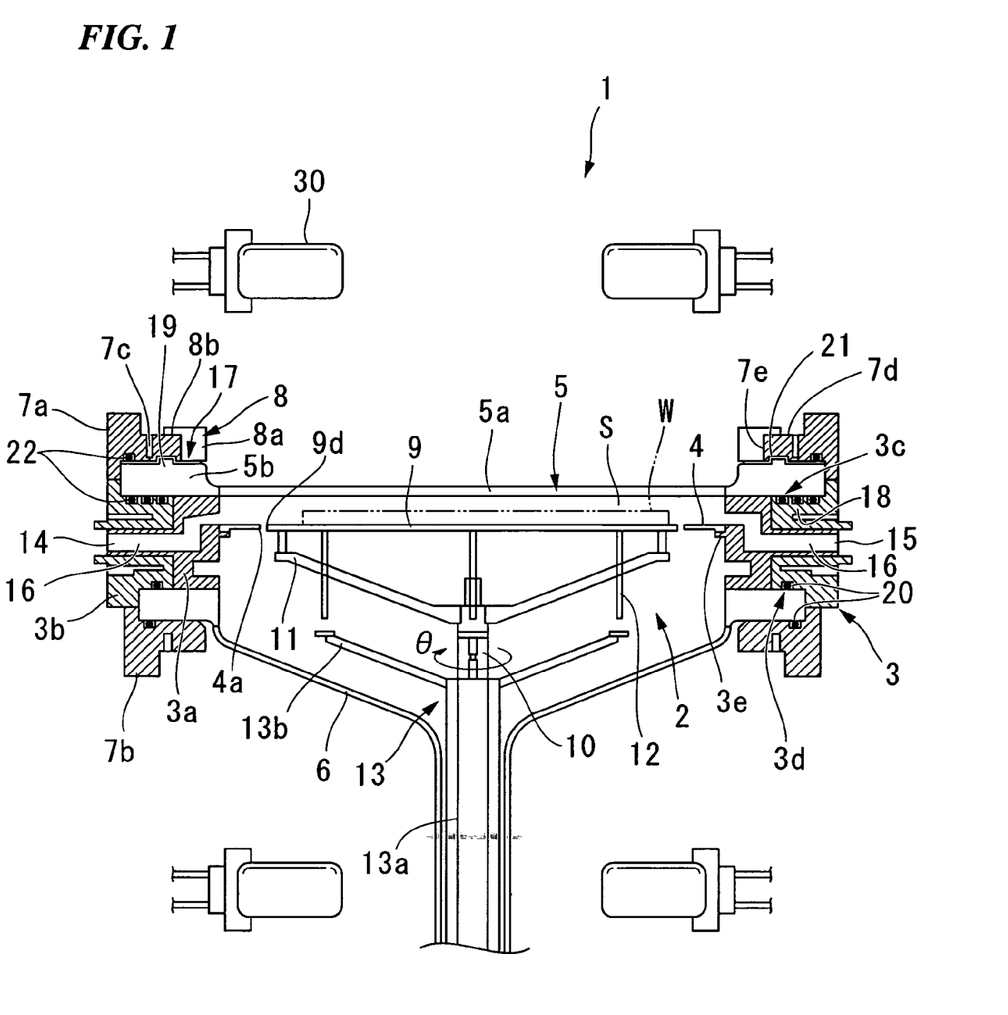
FIG. 1 is a diagram showing a configuration of the epitaxial apparatus according to the first embodiment of the present invention.

FIG. 1 is a diagram to show a configuration of an epitaxial apparatus 1 according to the first embodiment of the present invention.

The epitaxial apparatus 1 includes a suscepter (a supporting member) 9, an external wall 3, a susceptor ring (an inner lid member) 4, an upper dome (an upper lid member) 5, a lower dome 6, clamp rings which consist of an upper clamp ring (a holding member) 7a and a lower clamp ring 7b, an inner ring (a covering member) 8 and a heating portion (a heating unit) 30 as main components.

The epitaxial apparatus 1 is such type of apparatus that transfers a wafer W by pin-supporting the rear surface thereof, and is a batch type apparatus in which the inside thereof is heated and gas is supplied onto the surface of the wafer W; thereby an epitaxial layer is formed. A layer of silicon single crystal or the like is formed as the epitaxial layer. The gas supplied onto the surface of the wafer W may be, for example, a mixed gas of trichlorosilan ($SiHCl_3$, a silicon source) and hydrogen ($H_2$) or the like.

The susceptor 9 mainly functions as a supporting member to support the wafer W in a rotatable manner, and has a susceptor supporting portion 2, a susceptor rotating shaft 10, supporting arms 11, lifting pins 12, and a lift arm 13 as components for supporting the susceptor 9.

Figure 2:
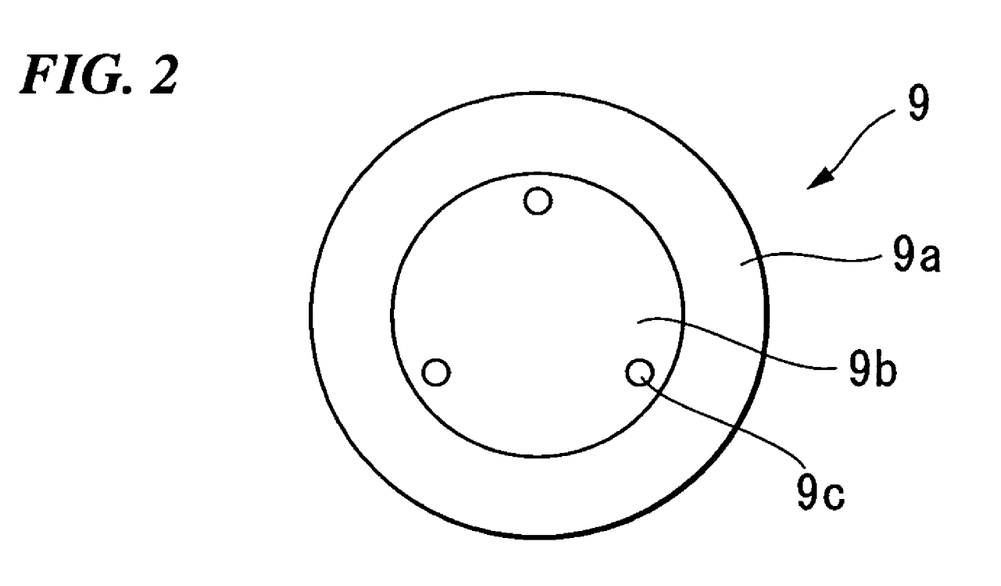
FIG. 2 is a diagram showing a configuration of the susceptor of the epitaxial apparatus according to the first embodiment.

The susceptor 9 is formed, for example, by coating a SiC film on a surface of a carbon base material. As shown in FIG. 2, as the susceptor 9, a disc-like shape with a recessed portion (having a base) in a middle portion 9b compared to a peripheral portion 9a may be used. The disc-like susceptor 9 shown in FIG. 2 will be explained below as an example. In the middle portion 9b, penetration holes 9c for the lifting pins 12 to pass through are formed in, for example, three places. This susceptor 9 supports the wafer W or the like.

Now back to FIG. 1, the susceptor rotating shaft 10 has a rotary mechanism such as a motor (not shown) and can rotate in the θ direction by the rotation of the rotary mechanism. The supporting arms 11 are assembled in such a manner that one end thereof is fitted together, for example, with the under surface of the susceptor 9 and the other end is fixed to the susceptor rotating shaft 10. These supporting arms 11 support the susceptor 9.

The lifting pins 12 are provided for supporting, at the pointed ends, the wafer W on the susceptor 9 so as to lift it up and down. For example, the lifting pins 12 are provided in three places to accurately fit with the location of each penetration hole 9c so that each lifting pin 12 rises from and sets to the corresponding penetration hole 9c. The lifting pins 12 are supported by the lift arm 13.

The lift arm 13 has an arm supporting portion 13a provided to cover the circumference portion of the susceptor rotating shaft 10, and arms 13b provided so as to stretch out from the arm supporting portion 13a. In the susceptor supporting portion 2, a lifting mechanism (not shown) such as an air cylinder or the like is provided. This lifting mechanism lifts the susceptor supporting portion 2 up and down; thereby lifting the supporting arms 11 up and down, and in turn lifts the susceptor 9 up and down.

The external wall 3 is a cylindrical member, for example, consisting of two layers. One is an inner layer 3a made of quartz or the like and another is an outer layer 3b made of a metal. The external wall 3 is provided to surround the susceptor 9 and the susceptor supporting portion 2 from the sides. The external wall 3 has a protruding portion 3e for attaching the susceptor ring 4 on the inner surface, and a gas supply port 14 and a gas exhaust port 15 on the outer surface.

The gas supply port 14 is a supply port to supply gas (e.g., aforementioned mixed gas of trichlorosilan and hydrogen, and the like) for forming a layer such as a silicon single crystal layer on the surface of the wafer W. The gas supply port 14 is constructed such that a gas supplying mechanism (not shown) or the like may be attached thereto.

The gas exhaust port 15 is a port for exhausting waste gas remaining after an epitaxial film has been formed. The gas exhaust port 15 is constructed such that an exhaust emission purifying mechanism (not shown) or the like which converts the waste gas exhausted from the gas exhaust port 15 into harmless substances may be attached thereto.

In the external wall 3, a gas distribution channel 16 that links the gas supply port 14 and the inner portion of the external wall 3 and a gas distribution channel 16 that links the inner portion of the external wall 3 and the gas exhaust port 15 are formed. The gas supply port 14, the gas exhaust port 15, and the circumference of the gas distribution channels 16 are made of quartz in like manner as the inner layer 3a; however, these may certainly be made of other materials as well.

The susceptor ring 4 is formed, for example, by coating a SiC film on a surface of a carbon base material in the same manner as the susceptor 9 and is provided in a removable manner to the protruding portion 3e on the external wall 3 so as to cover the gap between the susceptor 9 and the external wall 3. The susceptor ring 4 is constructed such that when the susceptor ring 4 is attached to the protruding portion 3e, the susceptor ring 4 and the protruding portion 3e are brought into tight contact with each other, so that an outer periphery 4a of the susceptor ring 4 is in close proximity to an outer periphery 9d of the susceptor 9. By putting the susceptor 9 and the susceptor ring 4 in close proximity to each other, the gas flowing into the epitaxial apparatus 1 from the gas supply port 14 is prevented from flowing to the back side of the wafer W.

The upper dome 5 is formed of material such as quartz or the like, and is a disc-like member provided so as to cover the inner portion of the external wall 3 from the upper end portion 3c side of the external wall 3. The upper dome 5 has a transparent central portion 5a and a non-transparent fringe portion 5b which is formed thicker than the central portion 5a. The fringe portion 5b of the upper dome 5 is held so as to be sandwiched by the upper end portion 3c and the upper clamp ring 7a through O rings 22 or the like, and an upper surface 17 and an lower surface 18 of the fringe portion 5b are in intimate contact respectively with the upper clamp ring 7a and the upper end portion 3c of the external wall 3. For example, on the upper end portion 3c side (on the outer layer 3b side), three O rings 22 may be provided, and one O ring 22 on the upper clamp ring 7a side. On the upper surface 17, a protruding portion 19 is provided.

The lower dome 6 is formed of material such as quartz or the like in the same manner as the upper dome 5, and is provided so as to cover the inner portion of the external wall 3 from the lower end portion 3d side of the external wall 3 while holding the periphery of the arm supporting portion 13a of the lift arms 13 in order to prevent the shaft center of the susceptor rotating shaft 10 from slipping from its original position. The lower dome 6 is held on the lower end portion 3d side of the external wall 3, in the same manner as the upper dome 5, so as to be sandwiched by the external wall 3 and the lower clamp ring 7b through O rings 20 or the like. The lower dome 6, the upper dome 5, the external wall 3 and the like form a chamber for forming epitaxial films.

The upper clamp ring 7a is made of material such as stainless steel, and is held at the upper end portion 3c of the external wall 3 to hold the fringe portion 5b on the outside of through the O rings 22. A recessed portion 21 that fits together with a protruding portion 19 provided on the upper surface 17 is provided in a portion where the fringe portion 5b makes tight contact with the upper surface 17. The protruding portion 19 and the recessed portion 21 fit together; thereby preventing the upper dome 5 from slipping from its proper position. Inside the upper clamp ring 7a, a circulation passage 7c for circulating a refrigerant such as water or the like is provided in the vicinity of the O rings 22. For example, the refrigerant can be circulated through the circulation passage 7c by attaching a pump (not shown) or the like to the circulation passage and driving it. Since the lower clamp ring 7b has almost the same structure as the upper clamp ring 7a, a description of the lower clamp ring 7b will be omitted.

Figure 3:
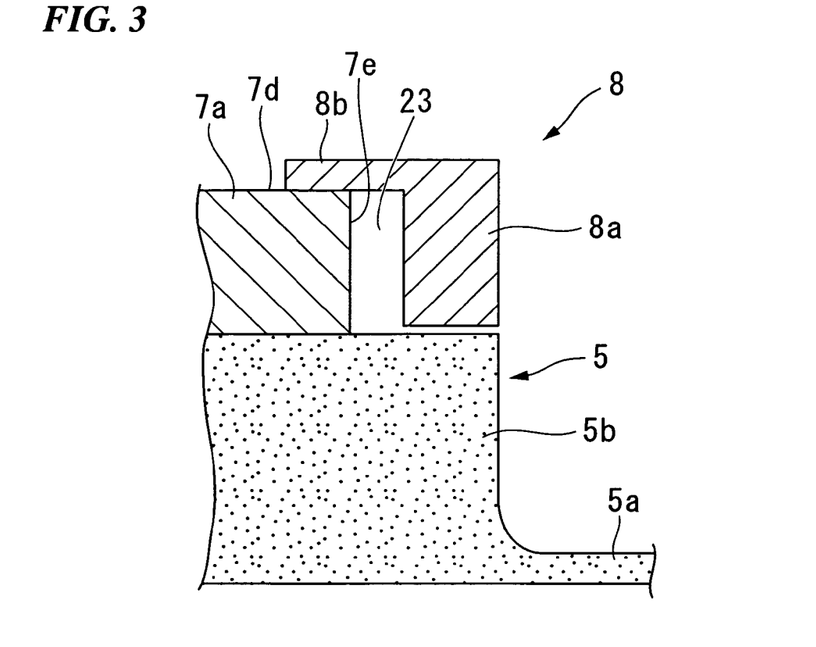
FIG. 3 is an enlarged view of the inner ring and its adjacent parts of the epitaxial apparatus.

The inner ring 8 is a covering member to cover the surface of the upper dome 5 and that of the upper clamp ring 7a, and is made of material such as stainless steel. The inner ring 8 has an engaging portion 8a that is fitted in the inner side of the upper clamp ring 7a, and an anchoring portion 8b that is latched together with an upper surface 7d of the upper clamp ring 7a, and is provided so as to be attachable to and removable from the upper dome 5 and the upper clamp ring 7a. When the inner ring 8 is attached (a state shown in FIG. 1), the engaging portion 8a covers a side face 7e of the upper clamp ring 7a and the inner side of the fringe portion 5b of the upper dome 5 while the anchoring portion 8b covers the upper surface 7d of the upper clamp ring 7a. The engaging portion 8a and the anchoring portion 8b are formed so as to fit to portions which are covered by the inner ring 8, such as an upper surface and a side face of the upper clamp ring 7a and the inner side of the fringe portion 5b of the upper dome 5. As shown in FIG. 3 (an enlarged view of the inner ring 8 and its adjacent parts shown in FIG. 1), the inner ring 8 is disposed so that a gap is provided between the engaging portion 8a and the fringe portion 5b of the upper dome 5, and a gap 23 is provided between the engaging portion 8a and the side face 7e of the upper clamp ring 7a.

For example, the engaging portion 8a may be substantially cylindrical, and the anchoring portion 8b may be provided in an outward flange shape around the periphery of the engaging portion 8a. The engaging portion 8a may be of any shape as long as it can shield the upper clamp ring 7a from thermal radiation of the portion of the epitaxial apparatus 1 where heat is applied, and is provided so as to cover the inner peripheral side of the upper clamp ring 7a, that is, the inner side when viewed from a plane parallel to the substrate (or wafer) W of the epitaxial apparatus 1. The anchoring portion 8b may be of any shape as long as it can latch together with the upper surface 7d of the upper clamp ring 7a, and is not necessarily be provided around the whole circumference of the engaging portion 8a. In such a case that the anchoring portion 8b is not provided around the whole circumference of the engaging portion 8a, the gap 23 provided between the engaging portion 8a and the side face 7e of the upper clamp ring 7a is well-ventilated with the outside air, so that heat transfer between the engaging portion 8a and the upper clamp ring 7a can be further suppressed.

A heating portion 30 is a heating unit to heat a region S surrounded by the susceptor 9, the external wall 3, the susceptor ring 4 and the upper dome 5, and is mostly constructed from a heater such as an infrared ray lamp and a halogen lamp or the like. Several heating portions 30 are disposed above and below the epitaxial apparatus 1.

Next, the operations of the epitaxial apparatus 1 structured as described above will be explained.

First, a wafer W is placed on the lifting pins 12 in such a state that the lifting pins 12 are protruded from the susceptor 9. When the wafer W is placed on the pointed end of the lifting pins 12, a lifting mechanism is driven to lift the susceptor 9; thereby placing the wafer W on the susceptor 9.

In a state in which the wafer W is held by the susceptor 9, hydrogen gas is supplied to the region S from the gas supply port 14, and the region S is heated by the heating portions 30 to be baked in hydrogen gas at a temperature of about 1,100° C. to 1,200° C. for a few seconds (10 seconds or less). After the baking in hydrogen gas, a mixed gas of trichlorosilan gas and hydrogen gas is supplied to the region S from the gas supply port 14 and the heating temperature is kept at a temperature of about 1,000° C. to 1,150° C. to grow an epitaxial film on the wafer W. When the epitaxial film is formed on the wafer W, the wafer W with the epitaxial film formed thereon is removed. Then, the inside of the region S is cleaned by HCl gas to remove remaining waste products. These are a series of operations for one cycle.

Figure 4:
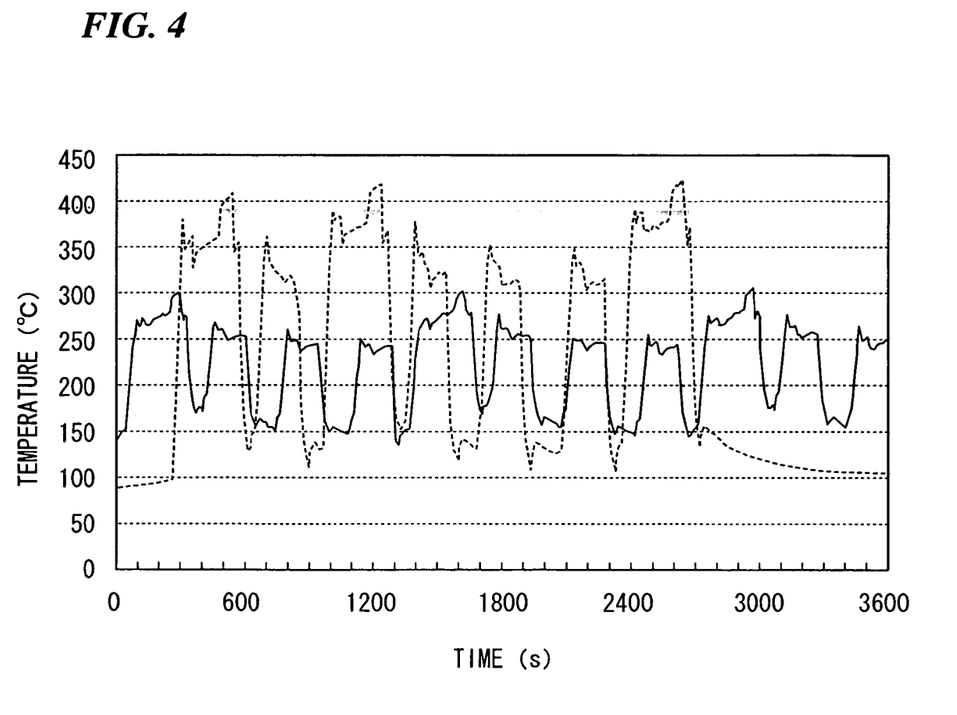
FIG. 4 is a graph showing temperature-time characteristics of the clamp ring when heat is applied.

FIG. 4 is a graph showing temperature changes of the inner peripheral portion of the upper clamp ring 7a when heat is applied.

The results shown in the graph are practically measured values. The results are plotted with temperature in ordinate and heating time in abscissa. In the graph, the solid lines show the values when heated using an epitaxial apparatus without the inner ring 8, and the broken lines show the values when heated using the above-described epitaxial apparatus 1 in which the inner ring 8 is mounted. In the graph, both of the solid lines and the broken lines periodically show extremely low temperatures. These are heat cycles corresponding to the periodical decreases in the output of the infrared heating lamps. Therefore, the greatest value of each period will be focused here and explained.

In the epitaxial apparatus without inner ring 8, the maximum temperature of the inner peripheral portion of the upper clamp ring 7a changes between 250° C. and 300° C. On the other hand, in the above-described epitaxial apparatus 1 in which the inner ring 8 is mounted, the maximum temperature of the same changes between 350° C. and 400° C. This result indicates that the temperature of the inner peripheral portion of the upper clamp ring 7a with the inner ring 8 being mounted on the apparatus is nearly 100° C. higher than that without it.

Figure 5:
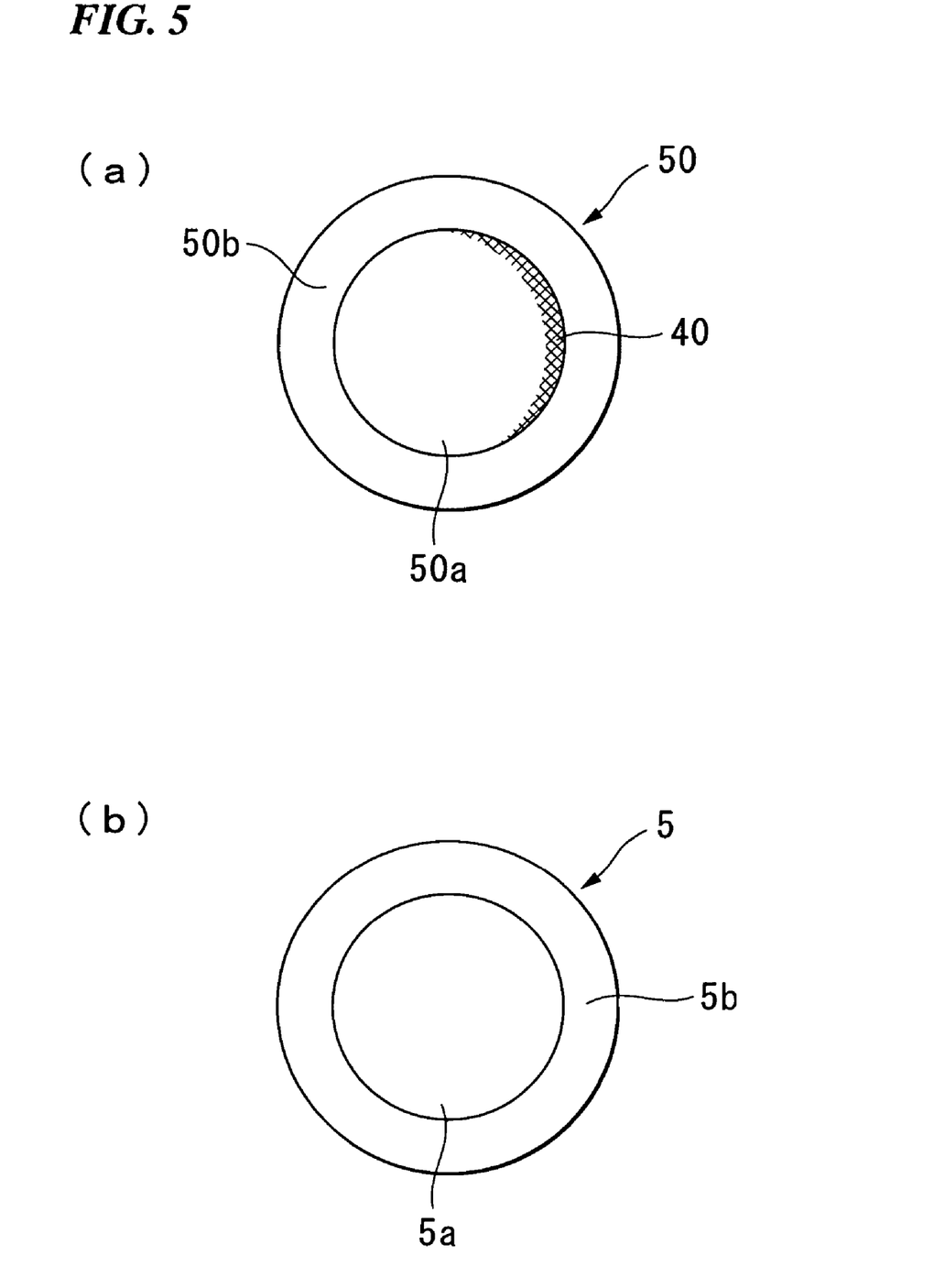

FIGS. 5 (a) and 5 (b) are views showing the state of waste products adhered to the upper dome after the series of operations for growing an epitaxial film have been carried out approximately 15,000 times by the epitaxial apparatus. FIG. 5 (a) shows the state when heat is applied using the epitaxial apparatus without the inner ring 8, and FIG. 5 (b) shows the state when heat is applied using the above-described epitaxial apparatus 1 in which the inner ring 8 is mounted.

As shown in FIG. 5 (a), while in the epitaxial apparatus in which the inner ring 8 is not mounted, adhered products 40 are just visible formed, for example, in a central portion 50a (in the vicinity of a peripheral portion 50b) in an upper dome 50, in the above-described epitaxial apparatus 1 in which the inner ring 8 is mounted, adhered products are hardly formed in the upper dome 5 as shown in FIG. 5 (b).

Since the temperature of the inner peripheral portion of the upper clamp ring 7a is nearly 100° C. higher with the inner ring 8 being mounted on the apparatus than without it as shown in FIG. 4, the temperature of the peripheral portion 5b of the upper dome 5 also rises due to radiant heat. On the other hand, the higher the temperature, the higher the cleaning efficiency of the upper dome 5 by HCl gas becomes. Therefore, the epitaxial apparatus 1 in which the inner ring 8 is mounted has higher cleaning efficiency of the upper dome 5 than the epitaxial apparatus without the inner ring 8. As a result, adhered products are hardly formed in the upper dome 5 of the above-described epitaxial apparatus 1.

As described above, in accordance with the present embodiment, the inner ring 8 is provided so as to cover the surface of at least one of the upper dome 5 and the upper clamp ring 7a; thereby making it difficult for the heat to escape from the portion covered by the inner ring 8. Consequently, a heat flow can be suppressed and thus, the temperature drop of the upper dome 5 and the susceptor ring 4 can be suppressed. Accordingly, the amount of residual products in the upper dome 5 can be reduced, and slippage caused in the wafer W by the difference in thermal stress can be suppressed.

Next, the second embodiment of the present invention will be described. In the same manner as that in the first embodiment, in order to make each member recognizable, a scale is suitably changed in the accompanying drawings. Moreover, the same reference numerals are used to designate elements which are the same as those in the above-described first embodiment, and detailed description thereof will be omitted. In the second embodiment, mainly the structure of the inner ring differs from that of the first embodiment. Thus, this different point will be focused on and described.

Figure 6:
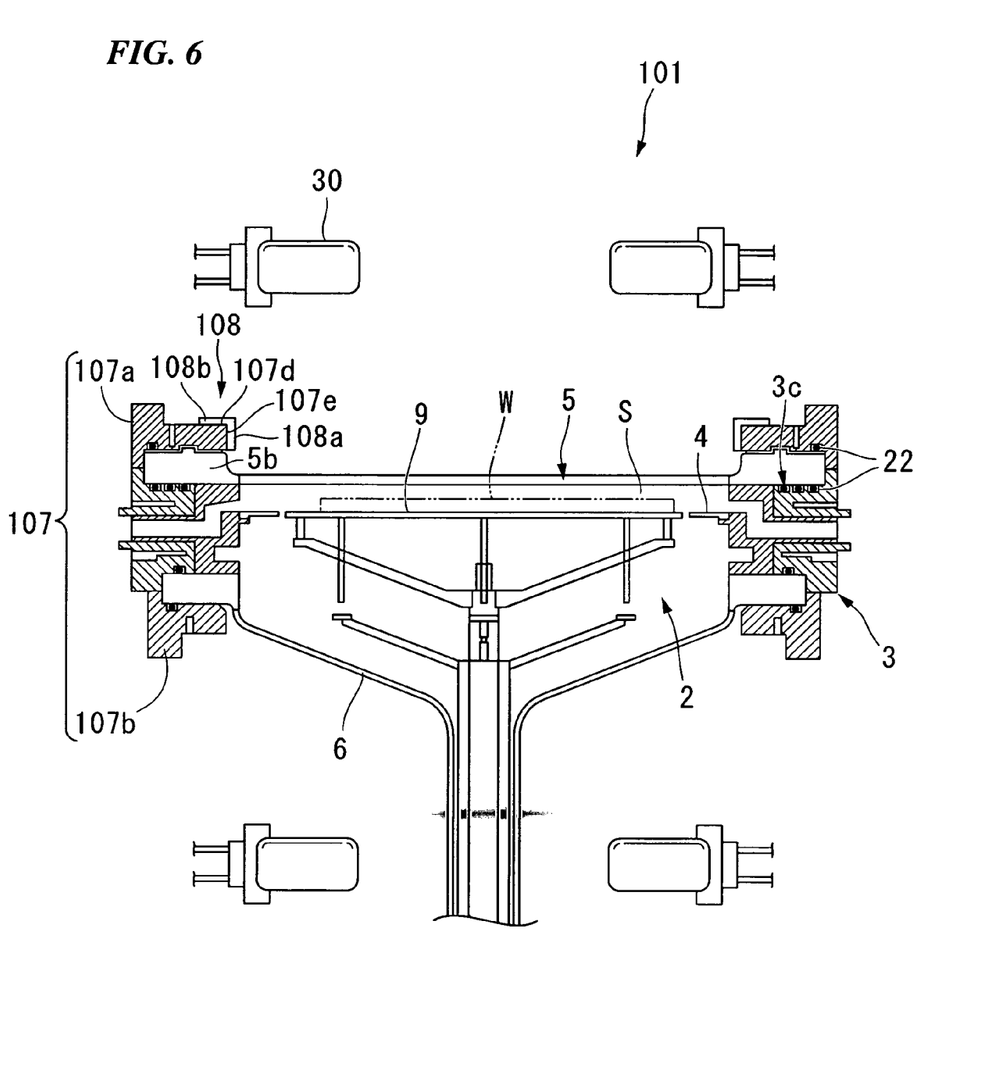
FIG. 6 is a diagram showing a configuration of the epitaxial apparatus according to the second embodiment of the present invention.

FIG. 6 is a diagram to show a configuration of an epitaxial apparatus 101 in accordance with the second embodiment.

The epitaxial apparatus 101 includes the susceptor (the supporting member) 9, the external wall 3, the susceptor ring (the inner lid member) 4, the upper dome (the upper lid member) 5, the lower dome 6, clamp rings 107 which consist of an upper clamp ring (a holding member) 107a and a lower clamp ring 107b, an inner ring (a covering member) 108 and the heating portions (the heating unit) 30 as main components.

Similarly to the first embodiment, the upper clamp ring 107a is made of material such as stainless steel, and is held at the upper end portion 3c of the external wall 3, and holds the whole portion of the fringe portion 5b of the upper dome 5 through the O rings 22. The present embodiment differs from the first embodiment in that the inner diameter of the fringe portion 5b of the upper dome and that of the upper clamp ring 107a almost agree.

Similarly to the first embodiment, the inner ring 108 is made of stainless steel. However, the present embodiment differs from the first embodiment in that the inner ring 108 covers only the surface of the upper clamp ring 107a. The inner ring 108 has an engaging portion 108a that is fitted in the inner side of the upper clamp ring 107a, and an anchoring portion 108b that is latched together with an upper surface 107d of the upper clamp ring 107a, and is provided so as to be attachable to and removable from the upper clamp ring 107a.

Figure 7:
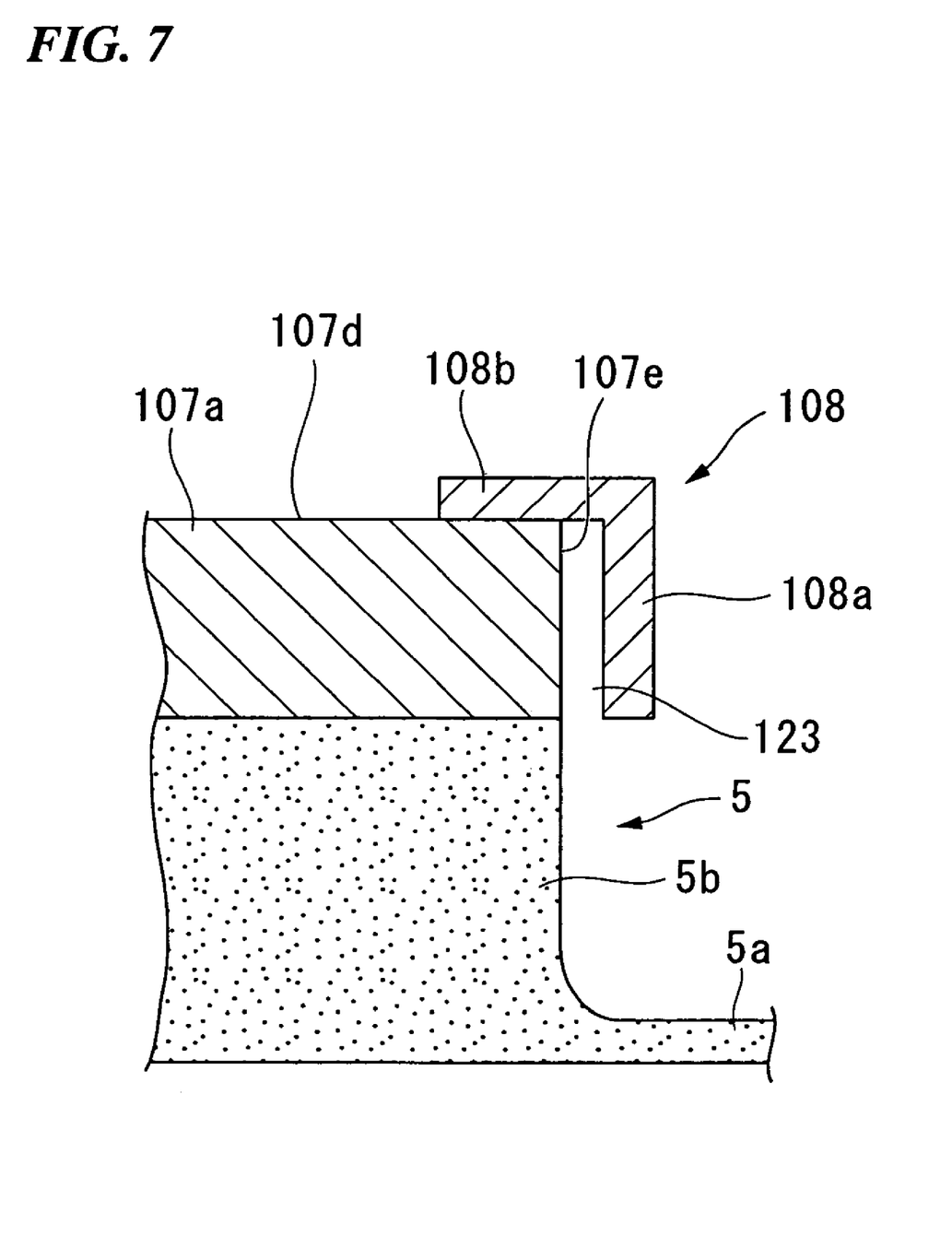
FIG. 7 is an enlarged view of the inner ring and adjacent parts of the epitaxial apparatus.

When the inner ring 108 is attached (a state shown in FIG. 6), the engaging portion 108a covers a side face 107e of the upper clamp ring 107a while the anchoring portion 108b covers the upper surface 107d of the upper clamp ring 107a. As shown in FIG. 7 (an enlarged view of the inner ring 108 and its adjacent portions shown in FIG. 6), the inner ring 108 is disposed so that a gap 123 is provided between the engaging portion 108a and the side face 107e of the upper clamp ring 107a.

As the present embodiment, the shape of the inner ring 108 may be designed in accordance with the shape of the upper clamp ring 107a. By covering the surface of the upper clamp ring 107a by the inner ring 108 designed as such, the heat escape from the surface can be suppressed.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

For example, in the above-described first embodiment, the inner ring 8 is structured so as to cover both of the upper dome 5 and the upper clamp ring 7a, while the inner ring 108 is structured so as to cover only the upper clamp ring 107a in the second embodiment. However, the inner diameter of the upper clamp ring 7a may be made larger than that of the fringe portion 5b of the upper dome 5, and the inner ring 8 may be disposed so as to cover the upper dome 5 only. Such a configuration can also suppress the heat flow.

What is claimed is:

1. An epitaxial apparatus for forming an epitaxial layer on a surface of a substrate by supplying gas thereon, the apparatus comprising:
a supporting member to support a substrate from the rear surface side thereof;
an external wall that is provided to surround said supporting member from the sides and that has a gas supply port for supplying gas on the front surface side of the substrate supported by said supporting member;
an inner lid member provided in a removable manner on said external wall and covering at least a part of a gap between said supporting member and said external wall;
an upper lid member that covers the front surface side of said substrate in a region surrounded by said external wall;
a holding member that is held by said external wall, holds said upper lid member so that said upper lid member is sandwiched between said holding member and said external wall, and has a cooling unit inside to cool down a portion that holds said upper lid member;
a heating unit to heat a region surrounded by said external wall, said supporting member, said inner lid member, and said upper lid member held by said external wall and said holding member; and
a covering member which is an inner ring provided on an inner peripheral side of said holding member so as to cover the surface of at least one of said upper lid member and said holding member,
wherein said covering member comprises an engaging portion that is fitted in an inner side of the said holding member, and an anchoring portion that is latched together with an upper surface of the holding member, and
said engaging portion is substantially cylindrical, and is provided so as to cover an inner peripheral side of said holding member.

2. The epitaxial apparatus according to claim 1, wherein said covering member is provided on said upper lid member in a removable manner.

3. The epitaxial apparatus according to claim 1, wherein said covering member is provided on said holding member in a removable manner.

4. The epitaxial apparatus according to claim 1, wherein a gap is provided between said covering member and said upper lid member or said holding member which is covered by said covering member.

5. The epitaxial apparatus according to claim 1, wherein thermal conductivity of said covering member is set in a range of 1 to 20 W/mK.

6. The epitaxial apparatus according to claim 1, wherein said covering member includes stainless steel.

* * * * *